United States Patent [19]
Otake et al.

[11] Patent Number: 4,904,954
[45] Date of Patent: Feb. 27, 1990

[54] ULTRASONIC SIGNAL AMPLIFIER CIRCUIT AND SYSTEM OF GAIN CONTROL THEREOF

[75] Inventors: Kan Otake, Tsuchiura; Junichi Kajiwara, Shimoinayoshi; Yoshio Akutsu, Chiyoda; Katsuyoshi Miyaji, Shimoinayoshi; Yoichi Katsuyama, Minori, all of Japan

[73] Assignee: Hitachi Construction Machinery Co., Ltd., Tokyo, Japan

[21] Appl. No.: 191,961

[22] Filed: May 9, 1988

[30] Foreign Application Priority Data

May 25, 1986 [JP] Japan .................................. 62-126032
May 8, 1987 [JP] Japan .................................. 62-111763
May 28, 1987 [JP] Japan .................................. 62-129910

[51] Int. Cl.⁴ .............................................. H03G 3/10
[52] U.S. Cl. ...................................... 330/281; 330/141
[58] Field of Search ........................... 73/631; 307/353; 328/151; 330/129, 133, 141, 278, 279, 281, 284

[56] References Cited

U.S. PATENT DOCUMENTS 3,651,255  3/1972  Kubota et al. ................... 330/281 X
4,037,163  7/1977  Nicholas .......................... 328/168 X
4,578,997  4/1986  Soltz .................................. 73/631 X Primary Examiner—Steven Mottola
Attorney, Agent, or Firm—Fay, Sharpe, Beall, Fagan, Minnich & McKee

[57] ABSTRACT

A gain of a variable gain amplifier circuit is controlled by applying a signal of a predetermined voltage level to the variable gain amplifier circuit during an idle period of an ultrasonic receiving signal, deriving an output from the variable gain amplifier circuit, comparing it with a voltage level obtained as an aimed value by a gain regulator or other control circuit of an ultrasonic signal amplifier circuit including the variable gain amplifier circuit and producing a gain control signal according to a difference resulting from the comparison to control the gain to the aimed value until the difference becomes zero. The gain of the variable gain amplifier circuit set in the idle period is maintained during a measurement period of a subsequent receiving signal so that the latter is amplified with the maintained gain. Thus, a stepwise and selective gain setting corresponding to the aimed value can be obtained by controlling the gain of the variable gain amplifier according to the aimed value.

17 Claims, 6 Drawing Sheets

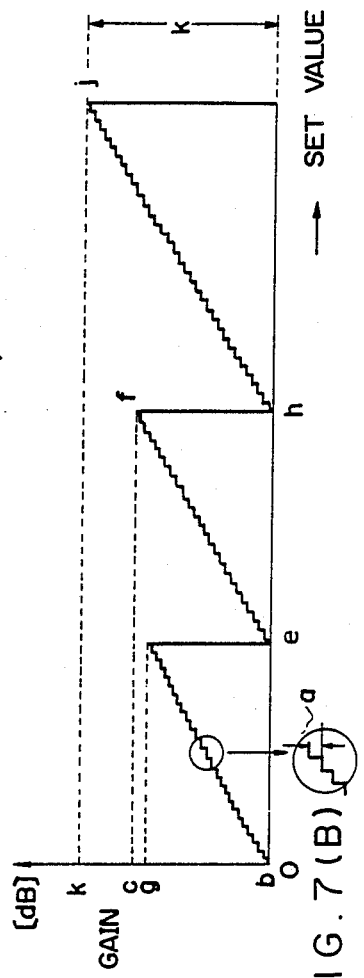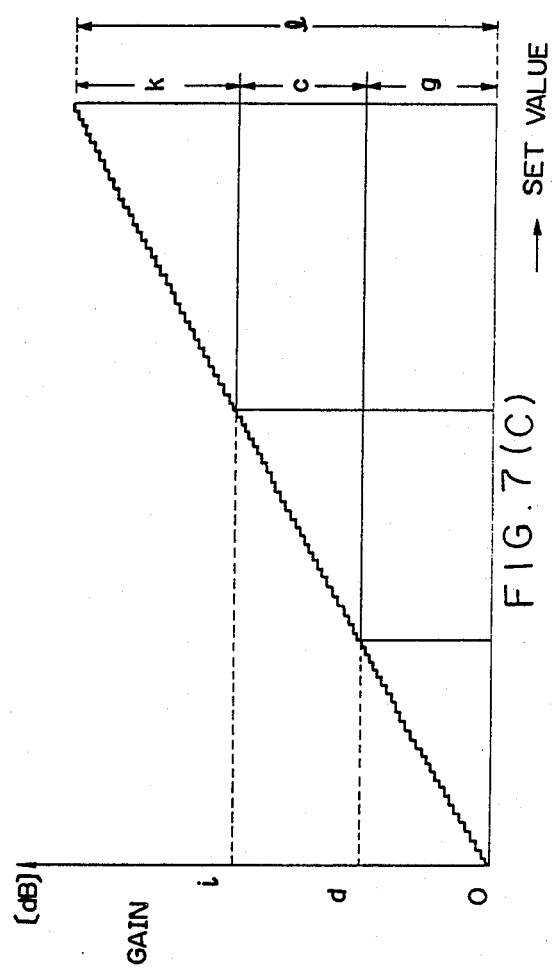

ULTRASONIC SIGNAL AMPLIFIER CIRCUIT AND SYSTEM OF GAIN CONTROL THEREOF

TECHNICAL FIELD

The present invention relates to an ultrasonic signal amplifier circuit and a system for controlling a gain thereof, and, particularly, to an improvement of an amplifier for use in various ultrasonic measurement devices such as ultrasonic flaw detector etc., in which a gain setting (or sensitivity regulation) thereof is facilitated and which is capable of providing a signal output of good S/N ratio.

1. Background Art

In an ultrasonic measuring device, a transmitting signal produced by a pulser/receiver is transmitted to an ultrasonic probe and converted by the probe into an ultrasonic signal which is transmitted to a material to be tested. An ultrasonic echo from the test material or an ultrasonic signal passed therethrough is received by the probe and amplified by the pulser/receiver after an acoustoelectric conversion. An amplified echo is detected by, for example, gating it. The transmitting signal is transmitted at a predetermined period and there is an idle period between the transmitting periods in which there is no transmission of the transmitting signal.

In such an ultrasonic measuring device, it is necessary, in order to amplify a receiving signal suitably, to use an amplifier having a gain set to a suitable value. The gain setting of the amplifier has been performed manally and externally. Such gain setting has been performed by attenuating the receiving signal by means of an attenuator which is of a multistage rotary switch type.

Each such attenuator is inserted between adjacent stages of high frequency amplifiers. At an input of a first stage amplifier of them, another such attenuator is provided, which has attenuating elements of 20 dB and 40 dB, respectively, which are selectable. The attenuator provided between the first stage amplifier and a second stage amplifier has 20 increment steps each of 2 dB to provide a total attenuation of 40 dB. The attenuator provided between the second stage amplifier and a third amplifier has 20 increment steps each of 0.5 dB, providing a total attenuation of 10 dB.

With such attenuators having different numbers of increment steps with different attenuations, a receiving signal having an input dynamic range from $10^4$ to $10^5$ can be amplified to provide a voltage of a suitable detection level.

In this case, however, there may be a number of combinations of attenuators and their increment steps to obtain a desired attenuation. On the other hand, in order to improve the S/N ratio of an output signal at an output terminal of the amplifier circuit, it is desired to make an input signal level for each amplifier stage as high as possible while below the saturation level thereof. It is, therefore, very important in operating the amplifier circuit without degrading the S/N ratio to select optimum settings of the respective attenuators. In order to realize such requirements, a considerable experience and skill of an operator have been required.

2. Disclosure of the Invention

The present invention has a gain of a variable gain amplifier of an amplifier circuit that is controlled by applying a signal of a predetermined voltage level thereto during an idle period of an ultrasonic receiving signal, deriving an output from the variable gain amplifier, comparing it with a voltage level obtained as an aimed value by a gain regulator or other control circuit of the amplifier circuit and producing a gain control signal according to a difference resulting from the comparison to control the gain to the aimed value until the difference becomes zero. The gain of the variable gain amplifier set in the idle period is maintained during a measurement period of a subsequent receiving signal so that the latter is amplified with the maintained gain.

Thus, a stepwise and selective gain setting corresponding to the aimed value can be obtained by controlling the gain of the variable gain amplifier according to the aimed value.

When the aimed value is a d.c. voltage signal, it is possible to set the gain finely and precisely.

Since it is possible to control the amplification of the amplifier circuit for an ultrasonic receiving signal by means of the gain control signal corresponding to the aimed value, there is no need of attenuating the ultrasonic receiving signal in a stepped manner. Therefore, it is possible to provide an output signal of an improved S/N ratio even when the receiving signal is very low level.

Due to the unnecessity of so many attenuators which are composed usually of resistive elements, an influence of frequency dependency on the amplifying characteristics of the amplifier circuit is reduced, resulting in the allowable use of inexpensive resistive elements. Thus, it is possible to simplify a circuit construction thereof.

Therefore, an object of the present invention is to provide an amplifier circuit for an ultrasonic receiving signal whose gain can be controlled by an external control signal in a stepped manner with high precision.

Another object of the present invention is to provide an amplifier circuit for an ultrasonic receiving signal whose gain can be set without using a number of attenuators inserted between amplifier stages.

A further object of the present invention is to provide an amplifier circuit for an ultrasonic receiving signal which is capable of providing an output signal of high S/N ratio.

A still further object of the present invention is to provide a gain control system for an amplifier circuit for an ultrasonic receiving signal in which a gain setting can be performed easily by an external control signal, finely and precisely.

BRIEF DESCRIPTION OF THE DRAWINGS

FIGS. 7A, 7B and 7C are timing charts for explanation of gain control timing of the amplifier circuit in FIG. 6.

DESCRIPTION OF THE PREFERRED EMBODIMENTS

Figure 1:
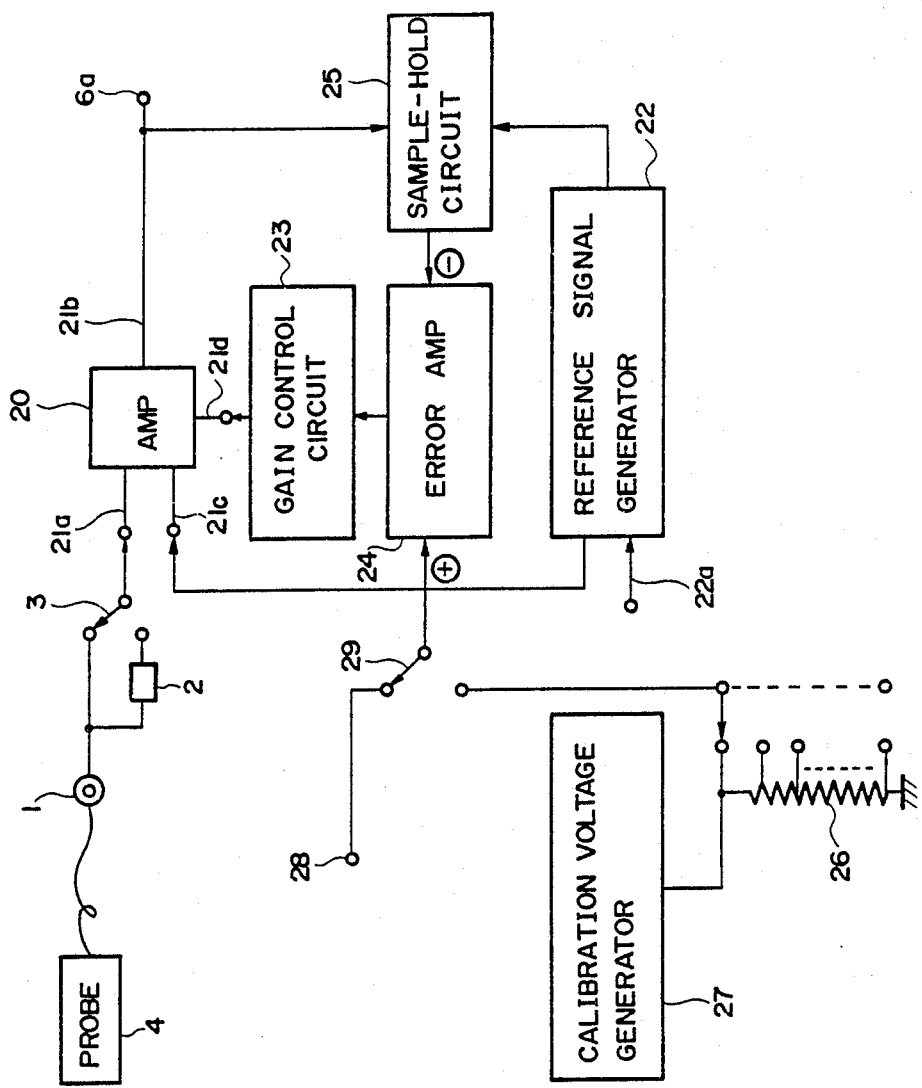
FIG. 1 is a block diagram of an amplifier circuit used in a ultrasonic measuring device according to an embodiment of the present invention.

In FIG. 1, a reference numeral 1 depicts a receiving input terminal for receiving an electric signal corresponding to an ultrasonic wave passed through a material to be measured or an echo therefrom which is received by an ultrasonic probe 4 of an ultrasonic measuring device, 2 an attenuator element and 3 an attenuation level switch. These components constitute the attenuator having two attenuation levels, one being 0 level and the other being 30 dB given by the attenuator element 2.

The input signal at the input terminal 1 is supplied through the switch 3 to a high frequency amplifier 20. The amplifier 20 has an input terminal 21a connected to an output of the switch 3, an output terminal 21b, another input terminal 21c for receiving a reference level signal and a gain control terminal 21d for receiving an external d.c. votage upon which a gain of the amplifier is controlled.

The reference level signal to be supplied to the input terminal 21c is a signal supplied from a reference signal generator 22 during an idle period in which no ultrasonic signal is received. The gain control terminal 21d is supplied with a gain control signal from a gain control circuit 23. The gain control signal is a d.c. signal obtained by amplifying an output of an error amplifier 24.

The reference signal from the reference signal generator 22 has, for example, rectangular waveform of a predetermined voltage level. An external pulse signal such as a clock signal is supplied to a terminal 22a of the reference signal generator 22, which is synchronous with a transmitting signal applied to the probe 4 and, so, is indicative of the idle period. The reference signal generator 22 also generates a sample signal in the idle period according to the external pulse signal.

The reference signal supplied to the amplifier 20 during the idle period is amplified thereby and provided at a terminal 6a which is an output terminal of the amplifier 20 as well as an input of a subsequent amplifier. The reference signal at the terminal 6a is also supplied to a sample-hold circuit 25.

The sample-hold circuit 25 holds the amplified reference signal in synchronism with the sampling signal. When the reference signal has a rectangular waveform as mentioned, the signal to be held by the sample-hold circuit 25 has a level corresponding to a d.c. component of the rectangular signal at the output of the amplifier 20. A sampled voltage value is supplied to a "−" (minus) input terminal of an error amplifier 24.

On the other hand, a "+" (positive) input terminal of the error amplifier 24 is supplied with a signal from a gain setting device 26. The gain setting device 26 is a voltage divider supplied with a constant voltage from a calibration voltage generator 27 and produces a control reference voltage as a gain setting signal (aimed value) by selecting one of the taps thereof.

The error amplifier 24 has an output connected to the gain control circuit 23.

With such circuit construction as mentioned above, a gain control feedback loop is formed by the sample-hold circuit 25 and the error amplifier 24 etc. When the error amplifier 24 is a differential, high gain amplifier, it continues to operate until the input level from the sample-hold circuit 25 coincides with the aimed value set by the gain setting device 26 to regulate the amplification factor of the amplifier 20. As a result, the output level of the error amplifier 24 becomes constant at a time of such coincidence, so that the amplification (gain) of the amplifier 20 is controlled to a constant value corresponding to the aimed value.

In the measuring period in which the ultrasonic receiving signal is supplied, the sample-hold circuit 24 continues to hold the value in the preceding idle period. Therefore, the error amplifier 24 receives the output of the sample-hold circuit 25 even when the amplifier 20 is receiving the receiving signal and thus the gain of the amplifier circuit 20 is not changed substantially from the set value during the measuring period.

The aimed value can be set arbitrarily according to a gain control signal from the gain setting device 26 or externally from an external terminal 28 which is supplied with a similar aimed value in the form of a d.c. voltage level as another control signal from an operation device including, for example, a microprocessor and, thus, the gain of the amplifier circuit 20 can be controlled steppingly during the idle period as mentioned previously. In this embodiment, either the setting device 26 or the extermanl terminal is selected as a source of gain control signal by a switch 29.

Figure 2:
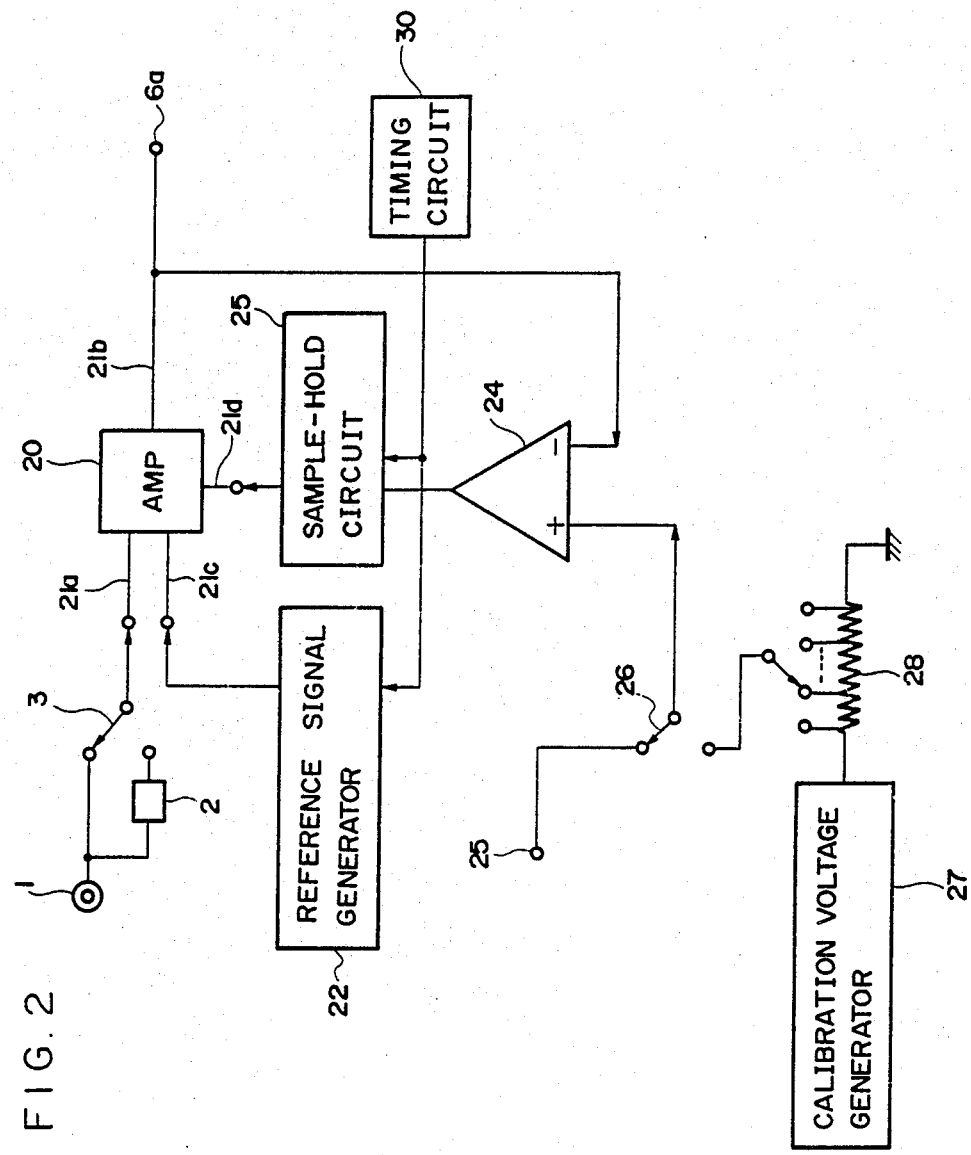
FIG. 2 is a block diagram of an amplifier circuit according to another embodiment of the present invention.

In another embodiment shown in FIG. 2, a sample-hold circuit 25 is used to hold a gain control signal as mentioned previously. In this case, an output of an amplifier circuit 20 is supplied directly to a "−" (minus) terminal of an error amplifier 24 whose output is supplied to the sample-hold circuit 25. The output of the sample-hold circuit 25 is supplied to a gain control terminal 21d of the amplifier circuit 20. Alternatively, it is possible to connect a gain control circuit 23 to the output of the sample-hold circuit 25, through which the gain control signal is supplied to the gain control terminal 21d, as shown in FIG. 1.

A timing circuit 30 provides a start signal to be supplied to a reference signal generator 22 to cause the latter to generate a reference signal during an idle period and a sampling signal to be supplied to the sample-hold circuit 25 to cause the latter to sample the receiving signal.

An operation of the circuit shown in FIG. 2 is similar to that of the circuit shown in FIG. 1 and it will be described with reference to FIG. 3.

Figure 3A:
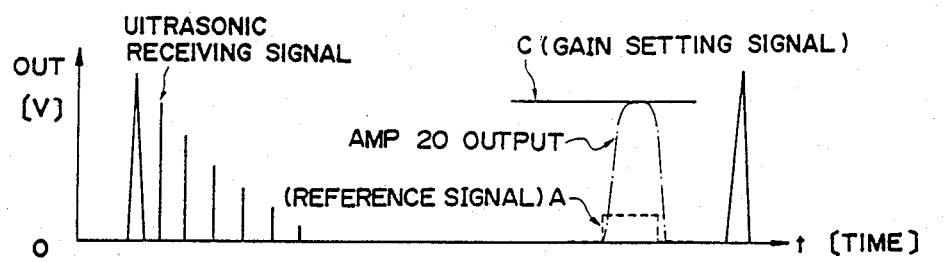
FIGS. 3A and 3B are a timing chart for explanation of an operation of the embodiment shown in FIG. 2.
Figure 3B:
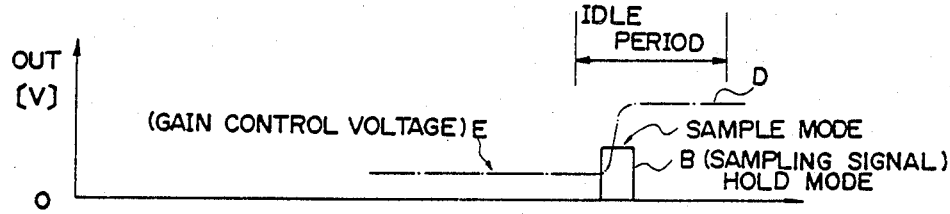

As shown in FIG. 3a, a reference signal A is generated by a reference signal generator 22 (FIG. 2) according to the start signal from the timing circuit 30, which is supplied to the amplifier circuit 20 during the idle period. Also as shown in FIG. 3b, the timing circuit 30 provides a sampling signal B indicative of a sampling period. The sampling signal is produced for a fixed time within the idle period, for which the sample-hold circuit 25 is switched to a sampling mode in operation. The error amplifier 24 operates in response to a difference between the gain setting signal C and the reference signal A.

An output of the amplifier circuit 20 is sampled and held by the sample-hold circuit 25, with which the gain of the amplifier circuit 20 is, for example, increased to amplify the reference signal A to the same level as that of the gain setting signal C as shown in FIG. 3a, a voltage level E of the gain setting signal with respect to the amplifier circuit 20 being increased gradually as shown in FIG. 3b until the amplified reference signal A coincides with the voltage level C of the gain setting signal. When the coincidence is achieved, the output of the error amplifier 24 becomes a fixed voltage D corresponding to the output voltage of the amplifier circuit, and, ultimately, the value D is sampled according to the sampling signal B from the timing circuit 30 and held thereby, so that the gain control signal E is fixed to the voltage level D. The sampled and held value D is maintained thereby till a subsequent idle period. Thus, the amplification of the amplifier circuit 20 is set by the gain control signal corresponding to the sampled value.

A relation between the operation of the error amplifier 24 and its output is the same as that of the gain control loop composed of the sample-hold circuit 25 and the error amplifier 24 in FIG. 1. In the case of the circuit shown in FIG. 2, the gain setting becomes more stable than the circuit in FIG. 1 since the gain control signal is held directly.

In FIG. 1 or 2, the input terminal 21a of the amplifier circuit 20 receives the input signal only during a time portion in the repetitive period of ultrasonic measuring, in which the ultrasonic signal from the material to be tested is received. In this case, the input level at the input terminal 21c is zero. This relation is reversed in the idle period. Therefore, it may be enough for the amplifier circuit 20 to have a single input terminal. In the latter case, it may be possible to provide a pair of input terminals in the upstream of the amplifier circuit 20 and to select either of them by means of a switch.

It is known in a ultrasonic flaw detector to provide a distance amplitude compensator (DAC) according to demand, since an amplitude of echo from a remote point is smaller than that from a close point even if flaws at these points are the same in size.

Figure 4:
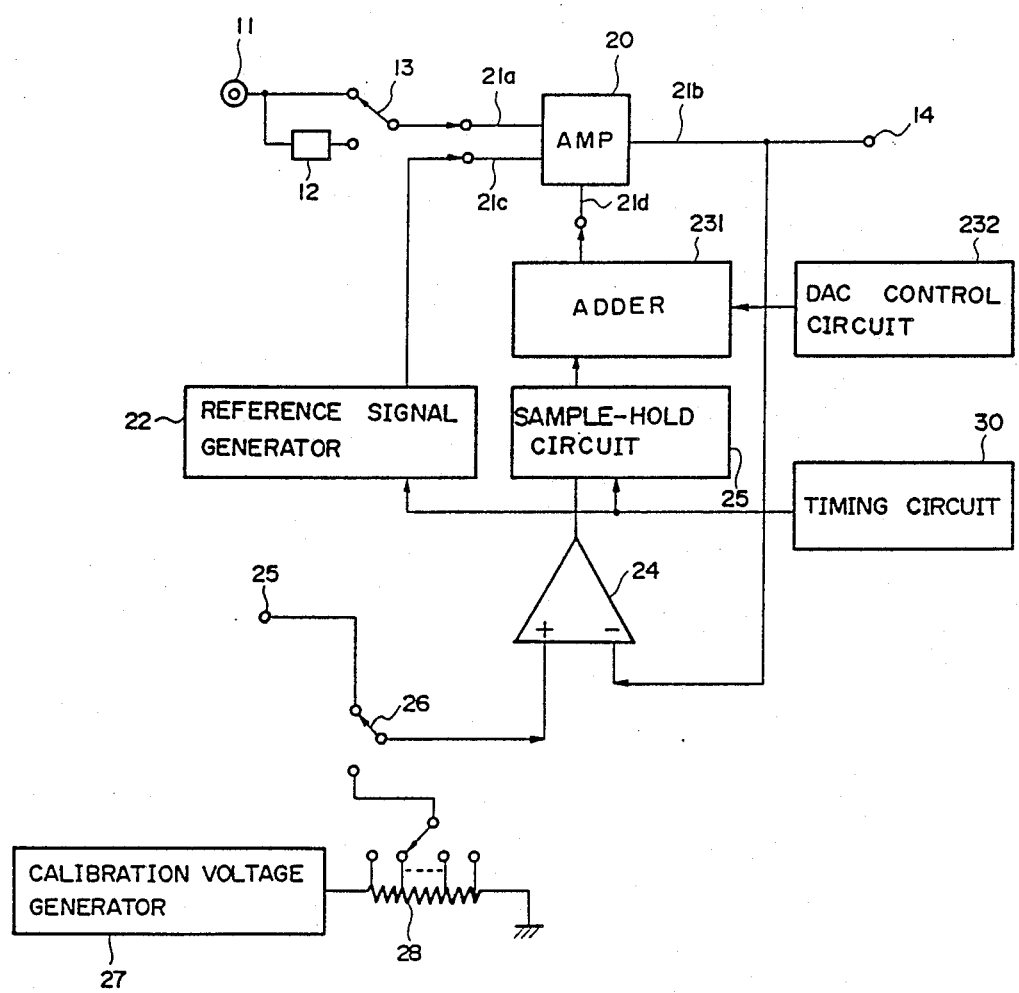
FIG. 4 is a block diagram of an amplifier circuit according to another embodiment of the present invention.

FIG. 4 shows another embodiment of the present invention which comprises, instead of the gain control circuit 23 in FIG. 1, a gain control circuit composed of an adder 231 and a DAC control circuit 232 so that the DAC can be achieved.

Figure 5:
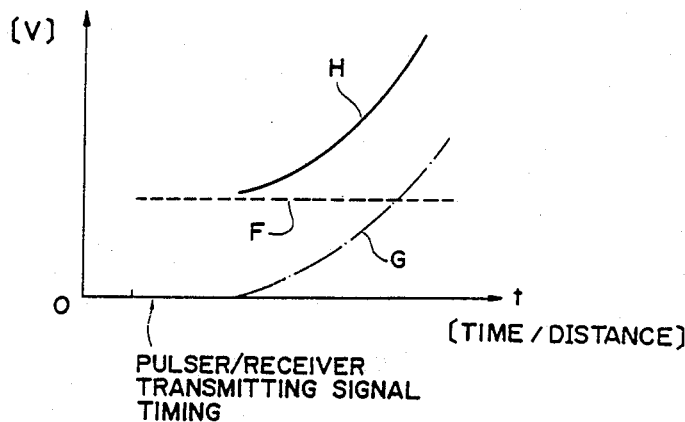
FIG. 5 is a standard sensitivity vs. DAC sensitivity curve showing a gain control characteristics of the embodiment shown in FIG. 4.

The embodiment in FIG. 4 operates in the same way as in the circuit in FIG. 1 or 2 during an idle period to produce a constant gain control signal as shown by a characteristics curve F in FIG. 5 to thereby control the amplifier circuit 20 so that the amplification thereof becomes constant. Subsequent to the idle period, the adder 231 provides a gain control signal from the DAC control circuit 232 that is synchronism with a generation of a transmitting signal to be sent to the probe 4 by the pulser/receiver. The gain control signal is shown by a characteristic curve G in FIG. 5 which increases gradually.

Therefore, the gain control signal provided by the adder 231 during a period in which the amplifier circuit 20 receives a ultrasonic receiving signal becomes a composite signal shown by a characteristic curve H in FIG. 5 which is a sum of the curves F and G. The gain corresponding to the reference gain (or standard sensitivity) at a start time of the DAC is set by the gain setting device 26 as shown by the curve F. Thereafter, the amplification of the amplifier circuit 20 is set such that its gain is distance/amplitude compensated automatically on the basis of the set gain.

The DAC control circuit 232 may be provided with a ramp voltage generator which can set the start time or a combination of an integrating circuit and a log amplifier etc. The start time of the DAC may be delayed suitably by controlling the switch circuit through a variable delay circuit.

Figure 6:
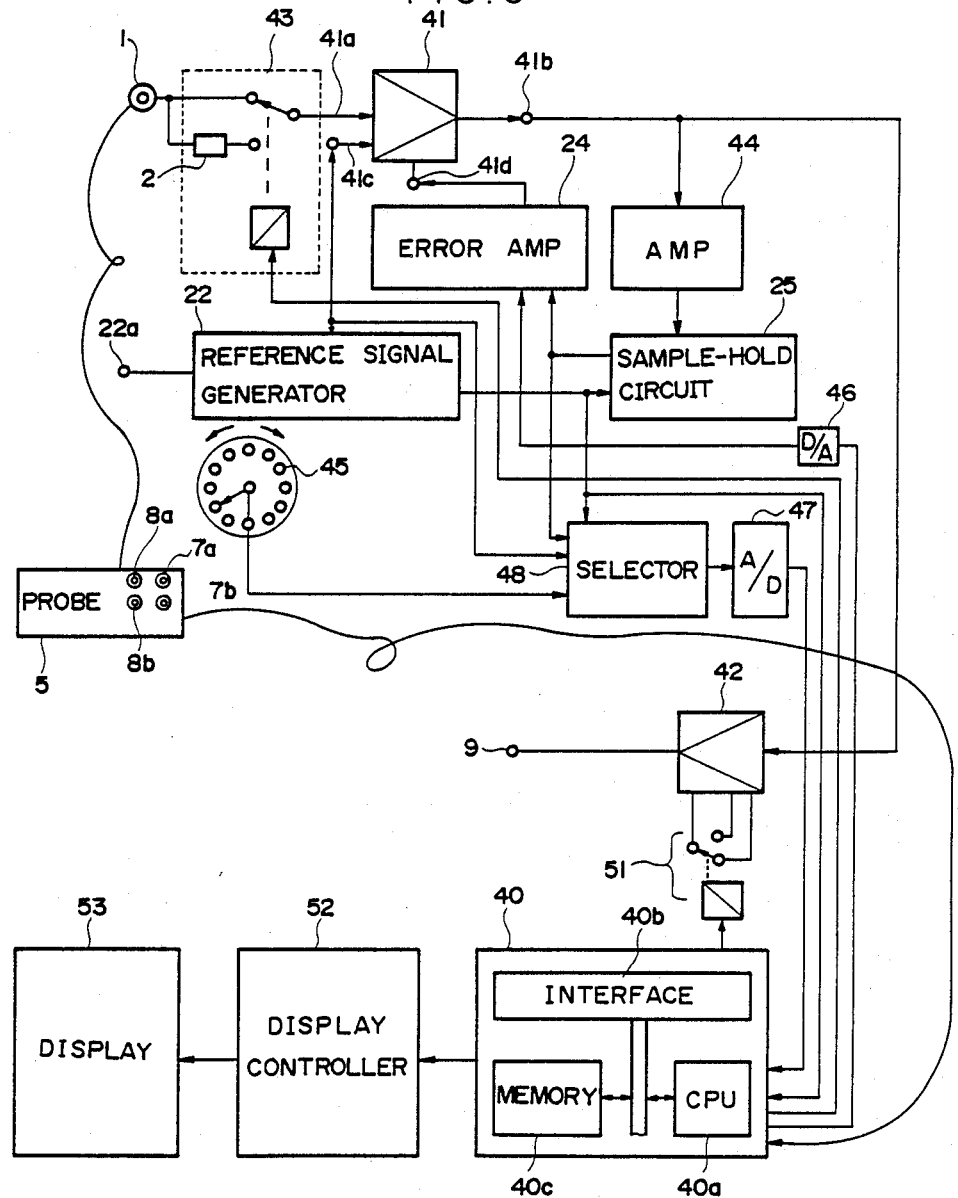
FIG. 6 is a block diagram of a control system including an amplifier circuit as a main component of an ultrasonic measuring device according to another embodiment of the present invention.

FIG. 6 shows another embodiment in which a voltage which is used as an aimed value of the error amplifier 24 is produced by a processing device 40 including a microprocessor to control an amplification of series connected high frequency amplifiers 41 and 42 steppingly.

A reference numeral 43 depicts an attenuator which has a through-passage and an attenuating passage including an attenuator element 2 either of which is selected according to a control signal from the processing device 40.

The amplifier 41 is similar to the amplifier 20 in FIG. 1 and adapted to receive a signal from the attenuator 43. The amplifier 41 has an input terminal 41a for receiving a receiving signal, an output terminal 41b, a reference level signal input terminal 41c and a gain control terminal 41d.

A reference numeral 44 depicts an amplifier inserted into an input side of the sample-hold circuit 25 and adapted to receive an output signal from the amplifier 41 to send it to the sample-hold circuit 25. The amplifier 44 includes a low pass filter for cutting a high frequency component off and functions additionally to improve an error detection rate. With an enlarging rate (=gain) being, for example, twice, it is possible to generate a doubled voltage setting level for each of the taps of the gain regulator 45 correspondingly, resulting in a more precise setting. The amplification of the amplifier 44 depends only on a relation thereof to the setting voltage of the gain regulator 45 and is independent from other control systems. Therefore, if it is desired to control with a 1 : 1 relation, the amplifier 44 may not always be necessary.

The error amplifier 24 compares the sample value from the sample-hold circuit 25 with an aimed value from the processor 40 and provides a control signal corresponding to the aimed value to the gain control terminal 41d of the amplifier 41 to control a gain of the amplifie 41 to a predetermined value corresponding to the aimed value. The signal which is the aimed value is supplied from the processor 40 through a D/A converter 46 as an analog voltage. The processor 40 includes a microprocessor (CPU) 40a, an interface 40b and a memory 40c, etc., and responds to a signal from the gain regulator 45 to supply the aimed value to the error amplifier 24. It further provides switch control signals for switching a switch 51 for controlling the amplification of an amplifier 42 in the downstream and the attenuator 43.

The gain regulator 45 comprises a rotary type setting voltage generator including a calibration voltage generator 27 and the gain regulator 26. A setting value thereof is sent through a selector 48 to an A/D converter 47 a digital output of which is supplied to the processor 40. When the gain regulator 45 is constituted with, for example, a rotary encoder, etc., it is possible to input the gain setting data directly to the processor 40 without using the A/D converter 47. In this case, the processor 40 can obtain pulses in the operating direction (direction of rotation) and pulses indicative of the amount of rotation, directly from the gain regulator 45. The processor 40 responds to a signal from the gain regulator 45 which indicates a change of the data or the operating direction to decide a changing direction, i.e., increase or decrease of gain and an original value by means of the CPU 40a thereof.

The selector 48 responds to a sample signal from the reference signal generator 22 as a timing signal to switch its connection from the gain regulator 45 to the reference signal generator 22 and the sample-hold circuit 25. When there is a sample signal during an idle period, the reference signal from the reference signal generator 22 and a sampled voltage held in the sample-hold circuit 25 are A/D converted by the A/D converter 47 and supplied to the processor 40. The latter also responds to the sample signal as a timing signal to obtain a preceding data of the gain setting device 45 as a gain setting value and to memorize it in the memory 40c.

The amplifier 42 amplifies an output of the amplifier 41 to a detection level and provides it at the output terminal 9. A gain of the amplifier 42 is changed in step by the switch 51.

A display controller 52 controls a total gain of the amplifier to display it on an external display device and generates character information for the gain display. This is connected through the interface 40b to the CPU 40a to generate a set value information of the gain regulator 45 to provide the character information to the display 53. The display 53 is composed of a CRT display or a liquid crystal display, etc.

With such construction as above mentioned, the CPU 40a of the processor 40 reads the set value of the gain regulator 45 through the interface 40b and obtains the aimed value to be supplied to the error amplifier 24 by accessing a specific region of the memory 40c in which the aimed value is stored.

As a result, the attenuation of the attenuator 43 and gains of the amplifiers 41 and 42 are controlled according to the aimed value corresponding to the gain setting operation of the width gain regulator 45, an aimed value and a switch control signal produced by the processor 40 when the aimed value becomes a specific value.

In order to realize this control, a function information about an aimed value corresponding to a control shown by a graph in FIG. 7A is stored as a digital value in the specific region of the memory 40c.

The ultrasonic probe 5 is equipped with coarse sensitivity regulation switches 7a and 7b and fine sensitivity switches 8a and 8b as a gain regulator having the same functions as those of the gain regulator 45. The gain regulator 45 is usually mounted on a front panel of an ultrasonic measuring device and has a dial to be operated on the device to select a desired gain (or sensitivity). The respective switches mentioned above are to perform such selection on the ultrasonic probe 5. In this embodiment, "ON" signals of these switches are supplied to the processor 40. The processor 40 increases the gain of the amplifier 41 by a constant amount every time when the coarse sensitivity switch 7a is turned on and decreases it by a constant amount every time when the coarse sensitivity switch 7b is turned on. Further, the processor 40 increaes the gain of the amplifier 41 at a small constant rate every time when the fine switch 8a is turned on and decreases similarly every time when the fine switch 8b is turned on. With such switches on the ultrasonic probe 5, it is possible to regulate the gain finely on the probe side.

A gain control operation of the ultrasonic receiving signal amplifier circuit will be described.

In an idle period, the error amplifier 24 compares a d.c. voltage supplied from the sample-hold circuit 25 with an aimed value signal in the form of a d.c. voltage obtained through the D/A converter 46 from the processor 40 to control the gain of the amplifier 41 until a difference therebetween disappears and the gain obtained when the difference disappears is set as a value corresponding to the aimed value.

In this case a reference voltage for the gain control loop is given by the processor 40 as the aimed value which is selected by the gain regulator 45. The aimed value is taken in the processor 40 as the operating direction of the gain regulator 45 and the amount thereof to determine them. From the determination, the processor 40 provides an aimed value obtained by accessing the memory 40c as a numerical control signal to the D/A converter 46. The processor 40 supplies switch control signals to the attenuator 43 and the switch 51 to switch the attenuation of the attenuator 43 and the gain of the amplifier 42 since, when the gain regulator 45 becomes in a predetermined position, the gain of the amplifier 41 becomes a predetermined value corresponding thereto. A new aimed value corresponding to a new gain obtained by this switching is obtained from the memory 40c and supplied to the error amplifier 24.

FIG. 7A shows the relation between the aimed value and the gain switching. FIG. 7B is an enlarged value thereof and FIG. 7C shows total gain of the receiving signal amplifier composed of the amplifiers 41 and 42. The respective characteristics curves in FIG. 7 are shown with gain on abscissa and setting value of the gain regulator 45 on the ordinate. In FIG. 7A, the gain of the amplifier 41 in FIG. 1 is increasing according to an increase operation (e.g., clockwise rotation ) of the gain regulator 45, and, in FIG. 7B, an increasing portion thereof is shown as enlarged. FIG. 7C, shows an increase of the total gain.

A resolution of operation of the gain of the amplifier 41 is limited by the processor 40 and the D/A converter 46, as shown by a portion a in FIG. 7B.

Assuming that a is, for example, 0.5 dB, the processor 40 controls the total gain such that the attenuator 43 and the gain switch 51 are set initially at the maximum attenuation point and the minimum gain point, respectively. In general, the total gain of the amplifier circuit is obtained by transforming an attenuation amount. In this embodiment, when the gains of the amplifiers 41 and 42 are minimum with the attenuation element 2 being inserted, the total gain of the amplifier circuit is 0 dB.

In FIG. 7A, when the gain of the amplifier 41 is increased from the point b gradually according to an increase operation of the gain regulator 45 to a point g (e.g., 30 dB) equal to the attenuation of the attenuation element 2, the CPU 40a removes the attenuation element 2 by controlling the attenuator 43 according to a preset program, so that an input receiving signal is directly received. At the same time, the aimed value to be sent to the error amplifier 24 is returned to the initial value so that the gain becomes 0 dB and sent to the D/A converter 46. The total gain in this case is held at a point d as shown in FIG. 7C.

With a further increase operation of the gain regulator 45, the gain of the amplifier 41 increases from an e point to an f point and then to the c point. At the c point, the CPU 40a of the processor 40 sends a control signal to the switch 51 to switch it to one step up (e.g., 35 dB) to thereby increase the amplification of the amplifier 42 by a constant amount corresponding to the c point. At the same time, the aimed value for the error amplifier 24 is returned to its initial value to return the gain of the amplifier 41 from the f point to a h point corresponding to 0 dB, automatically.

It should be noted that the points g and c may be set to other values than 30 dB and 35 dB, such as 40 dB and 20 dB, or, alternatively, they may be the same.

In this case, the total gain becomes an i point and, with a further operation of the gain regulator 45, it reaches a j point, achieving a limit value (k dB) of the amplifier 41.

In this case, the total gain is set to $l = (g + C + k)$.

For a reverse, i.e., decrease operation of the total gain, it is enough to perform the above mentioned operations in a reverse directions. That is, the processor 40 reads a decrease operation from the operation of the gain regulator 45 and controls the others according to the program.

The gain control of the amplifier 41 by the processor 40 is recirculative. Therefore, it is possible to set an aimed value without using a special program by providing a soft counter in the region of the memory 40c, increasing or decreasing it by means of pulses corresponding to an amount of operation of the gain regulator 45, multiplying a counter value of the soft counter with a certain coefficient to obtain the aimed value and supplying it to the error amplifier 24. And, when the counter value becomes a specific gain value corresponding to the point g or c in FIG. 7A, a switch control signal for the attenuator 43 or a gain switch control signal for the amplifier 41 is generated to reset the counter.

It is possible to provide a program in the processor 40, which reads, in addition to the increase or decrease operation of gain, i.e., clockwise or counterclockwise rotation of the gain regulator 45, operation speed thereof to allow an alarm against a setting condition of the operation or a too high speed operation to be generated.

A gain value to be set time to time by the operation of the gain regulator 45 is sent through the processor 40 to a display controller 52 and an alphanumeric information indicative of a gain obtained by the display controller 52 is displayed externally on the display 53. In this embodiment, the memory of the processor 40 has a decibel processing program and the processor 40 receives, during the idle period, a digital value of the reference signal voltage from the reference signal generator 22 through the A/D converter 47 and a digital value of a voltage held in the sample-hold circuit 25, through the interface 40b, and memorizes them in the memory 40c. Then, the decibel processing program is performed to obtain a ratio between these digital values to thereby obtain a decibel value therebetween. A result of the operation is sent to the display controller 52 and displayed on the display 53.

The attenuator in the described embodiment has no direction connection route externally and is capable of switching the attenuation from a direct to an attenuation setting. However, it may be possible to provide an external direct connection and an attenuator separately. In such case, it is possible to make them all as an attenuator.

Although in this embodiment the portion which controls the gain of the amplifier for amplifying the receiving signal is divided into the sample-hold circuit and the error amplifier, it is possible to constitute a control circuit composed of them as a whole.

Although in this ebodiment a rectangular wave is used as the reference signal, it may be a sinusoidal wave. In the case of a rectangular wave, the output is obtained as a d.c. value and a d.c. component thereof becomes a voltage value to be compared. In this case, it is possible to output a rectangular wave from the processor etc., which takes in HIGH ( or LOW) level during a period corresponding to the idle period of the ultrasonic receiving signal. In such case, since the level itself becomes a component to be compared, it is equivalent to the d.c. output.

Although in the embodiment the reference signal is amplified and its level is feedback controlled such that it becomes coincident with the aimed value, the level may be controlled such that it is attenuated by a high frequency amplifier circuit and the attenuated reference signal becomes coincident with the aimed value.

Although in the embodiment the control voltage corresponding to the aimed value is generated by the error amplifier, the latter may be a differential amplifier or other 2-input amplifier such as an operational amplifier whose reference voltage input side is assigned to the aimed value and the other signal input side has a feedback loop including an amplifier for the ultrasonic receiving signal.

What is claimed is:

1. An amplifier circuit for an ultrasonic receiving signal comprising a variable gain amplifying circuit for amplifying an ultrasonic receiving signal, said variable gain amplifying circuit having a gain variable according to a gain control signal, a reference signal generator for supplying a reference signal to said variable gain amplifying circuit during an idle period in which there is no said receiving signal, an aimed value generator for generating an aimed value corresponding to a gain set and a control circuit responsive to a difference between said aimed value and a value of said reference signal amplified by said variable gain amplifying circuit during said idle period to generate said gain control signal corresponding to said aimed value and holding it for at least a time in which said receiving signal exists.

2. The amplifier circuit as claimed in claim 1, wherein said reference signal is a d.c. signal having a constant level, and wherein said control circuit comprises an error amplifier.

3. The amplifier circuit as claimed in claim 1, wherein said control circuit comprises a hold circuit for holding said amplified reference signal held during said idle period for said time in which said receiving signal exists and an error amplifier responsive to a difference between said aimed value and said reference signal value to generate said gain control signal during said idle period.

4. The amplifier circuit as claimed in claim 3, wherein said aimed value generator comprises a processing device including a microprocessor.

5. The amplifier circuit as claimed in claim 4, wherein said processing device includes an operation processing device for calculating a display value of a gain of said variable gain amplifying circuit on the basis of a voltage level of said reference signal from said reference signal generator and a voltage level of said amplified reference signal amplified by said variable gain amplifying circuit and a display device responsive to said display value to display the same.

6. The amplifier circuit as claimed in claim 1 wherein said aimed value generator comprises a circuit for supplying a constant d.c. voltage and a circuit for providing a fraction of said constant d.c. voltage according to an external selective operation, said fraction being settable in step by said external selective operation.

7. The amplifier circuit as claimed in claim 1 wherein said control circuit includes a first and a second gain control circuits, said first gain control circuit being responsive to said difference between said aimed value and said amplified reference signal value to generate a first gain control signal corresponding to said aimed value during said idle period, said second gain control circuit being adapted to generate a second gain control signal for distance-amplitude compensation during said time in which said receiving signal exists, said first and said second gain control signals being overlapped to form said gain control signal.

8. A gain control system for an ultrasonic wave receiving signal amplifier circuit, comprising an attenuator having switchable attenuations for attenuating an ultrasonic receiving signal with any of said attenuations, a variable gain amplifier circuit adapted to receive and amplify selectively said receiving signal attenuated by said attenuator, said variable gain amplifier circuit having an amplification gain variable according to a gain control signal, a reference signal generator for supplying a reference signal to said variable gain amplifier circuit during an idle period in which there is no said receiving signal, a sample-hold circuit for sampling and holding said reference signal amplified by said variable gain amplifier circuit, a setting means for selectively setting said gain and a control circuit for generating an aimed value according to a setting value of said setting means, comparing said aimed value with a value sampled and held by said sample-hold circuit and generating said gain control signal according to a difference between said aimed value and said sampled and held value, said control circuit controlling said gain of said variable gain amplifier circuit according to a selection of gain by said setting means when said variable gain amplifier circuit is receiving said ultrasonic receiving signal attenuated by said attenuator, said attenuator being switched so that said variable gain amplifier circuit receives said receiving signal without attenuation and said aimed value is selected such that said gain of said variable gain amplifier circuit is decreased by an amount corresponding to said attenuation, when said controlled gain increases to a value at which said attenuation is cancelled out.

9. The gain control system as claimed in claim 8, wherein said reference signal is a d.c. voltage of a constant level, said variable gain amplifier includes a first and a second amplifier stages, said reference signal from said reference signal generator is supplied to said first amplifier stage, said sample-hold circuit samples and holds an output signal of said first amplifier stage during said idle period, said control circuit supplies said gain control signal to said first amplifier stage and controls gains of said first and said second amplifier stages such that the gain of said second amplifier stage is increased by a predetermined value and the gain of said first amplifier stage is decreased by the predetermined value, when the gain of said first amplifier stage reaches said predetermined value when said first amplifier stage is receiving said receiving signal without attenuation, to select said aimed value.

10. The amplifier circuit as claimed in claim 2, wherein said aimed value generator comprises a circuit for supplying a constant d.c. voltage and a circuit for providing a fraction of said constant d.c. voltage according to an external selective operation, said fraction being settable in step by said external selective operation.

11. The amplifier circuit as claimed in claim 3, wherein said aimed value generator comprises a circuit for supplying a constant d.c. voltage and a circuit for providing a fraction of said constant d.c. voltage according to an external selective operation, said fraction being settable in step by said external selective operation.

12. The amplifier circuit as claimed in claim 4, wherein said aimed value generator comprises a circuit for supplying a constant d.c. voltage and a circuit for providing a fraction of said constant d.c. voltage according to an external selective operation, said fraction being settable in step by said external selective operation.

13. The amplifier circuit as claimed in claim 5, wherein said aimed value generator comprises a circuit for supplying a constant d.c. voltage and a circuit for providing a fraction of said constant d.c. voltage according to an external selective operation, said fraction being settable in step by said external selective operation.

14. The amplifier circuit as claimed in claim 2, wherein said control circuit includes a first and a second gain control circuit, said first gain control circuit being responsive to said difference between said aimed value and said amplified reference signal value to generate a first gain control signal corresponding to said aimed value during said idle period, said second gain control circuit being adapted to generate a second gain control signal for distance-amplitude compensation during said time in which said receiving signal exists, said first and said second gain control signals being overlapped to form said gain control signal.

15. The amplifier circuit as claimed in claim 3, wherein said control circuit includes a first and a second gain control circuit, said first gain control circuit being responsive to said difference between said aimed value and said amplified reference signal value to generate a first gain control signal corresponding to said aimed value during said idle period, said second gain control circuit being adapted to generate a second gain control signal for distance-amplitude compensation during said time in which said receiving signal exists, said first and said second gain control signals being overlapped to form said gain control signal.

16. The amplifier circuit as claimed in claim 4, wherein said control circuit includes a first and a second gain control circuit, said first gain control circuit being responsive to said difference between said aimed value and said amplified reference signal value to generate a first gain control signal corresponding to said aimed value during said idle period, said second gain control circuit being adapted to generate a second gain control signal for distance-amplitude compensation during said time in which said receiving signal exists, said first and said second gain control signals being overlapped to form said gain control signal.

17. The amplifier circuit as claimed in claim 5, wherein said control circuit includes a first and a second gain control circuit, said first gain control circuit being responsive to said difference between said aimed value and said amplified reference signal value to generate a first gain control signal corresponding to said aimed value during said idle period, said second gain control circuit being adapted to generate a second gain control signal for distance-amplitude compensation during said time in which said receiving signal exists, said first and said second gain control signals being overlapped to form said gain control signal.

* * * * *